United States Patent
Schröder et al.

(10) Patent No.: US 8,436,302 B2
(45) Date of Patent: May 7, 2013

(54) PHASE-SHIFTING ELEMENT AND PARTICLE BEAM DEVICE HAVING A PHASE-SHIFTING ELEMENT

(75) Inventors: Rasmus Schröder, Heidelberg (DE); Bastian Barton, Frankfurt (DE); Gerd Benner, Aalen (DE); Harald Rose, Darmstadt (DE)

(73) Assignees: Carl Zeiss Microscopy GmbH, Jena (DE); Max-Planck-Gesellschaft zur Foerderung der Wissenschaften E.V., Munich (DE)

( * ) Notice: Subject to any disclaimer, the term of this patent is extended or adjusted under 35 U.S.C. 154(b) by 0 days.

(21) Appl. No.: 13/462,140

(22) Filed: May 2, 2012

(65) Prior Publication Data

US 2013/0001445 A1 Jan. 3, 2013

Related U.S. Application Data

(60) Continuation of application No. 12/931,046, filed on Jan. 20, 2011, now Pat. No. 8,173,963, which is a division of application No. 12/070,055, filed on Feb. 14, 2008, now Pat. No. 7,902,506.

(30) Foreign Application Priority Data

Feb. 14, 2007 (DE) .......................... 10 2007 007 923

(51) Int. Cl.
*G01N 23/00* (2006.01)

(52) U.S. Cl.
USPC .. 250/311; 250/310; 250/396 R; 250/396 ML

(58) Field of Classification Search .................. 250/310, 250/311, 396 R, 396 ML
See application file for complete search history.

(56) References Cited

U.S. PATENT DOCUMENTS

| | | | | | |
|---|---|---|---|---|---|
| 4,962,313 | A | * | 10/1990 | Rose | 250/311 |
| 5,221,844 | A | * | 6/1993 | van der Mast et al. | 250/398 |
| 5,336,885 | A | * | 8/1994 | Rose et al. | 250/305 |
| 6,797,956 | B2 | * | 9/2004 | Benner | 250/311 |
| 7,012,262 | B2 | * | 3/2006 | Rose | 250/396 ML |
| 7,209,291 | B2 | * | 4/2007 | Hanson et al. | 359/619 |
| 7,321,124 | B2 | * | 1/2008 | Rose | 250/396 ML |
| 7,741,602 | B2 | * | 6/2010 | Benner et al. | 250/311 |
| 7,902,506 | B2 | * | 3/2011 | Schroder et al. | 250/311 |
| 8,173,963 | B2 | * | 5/2012 | Schroder et al. | 250/311 |
| 2003/0132383 | A1 | * | 7/2003 | Benner | 250/311 |
| 2005/0128594 | A1 | * | 6/2005 | Hanson et al. | 359/619 |
| 2006/0102848 | A1 | * | 5/2006 | Rose | 250/396 ML |
| 2007/0158567 | A1 | * | 7/2007 | Nakamura et al. | 250/311 |
| 2007/0284528 | A1 | * | 12/2007 | Benner et al. | 250/311 |
| 2008/0283749 | A1 | * | 11/2008 | Muller et al. | 250/311 |
| 2008/0296509 | A1 | * | 12/2008 | Schroder et al. | 250/398 |
| 2009/0200464 | A1 | * | 8/2009 | Tiemeijer et al. | 250/307 |
| 2010/0038537 | A1 | * | 2/2010 | Benner | 250/311 |
| 2010/0051807 | A1 | * | 3/2010 | Barton et al. | 250/311 |

* cited by examiner

*Primary Examiner* — David A Vanore
(74) *Attorney, Agent, or Firm* — Muirhead and Saturnelli, LLC

(57) ABSTRACT

A phase-shifting element for shifting a phase of at least a portion of a particle beam is described, as well as a particle beam device having a phase-shifting element of this type. In the phase-shifting element and the particle beam device having a phase-shifting element, components shadowing the particle beam are avoided, so that proper information content is achieved and in which the phase contrast is essentially spatial frequency-independent. The phase-shifting element may have at least one means for generating a non-homogeneous or anisotropic potential. The particle beam device according to the system described herein may be provided with the phase-shifting element.

24 Claims, 18 Drawing Sheets

FIG. 7
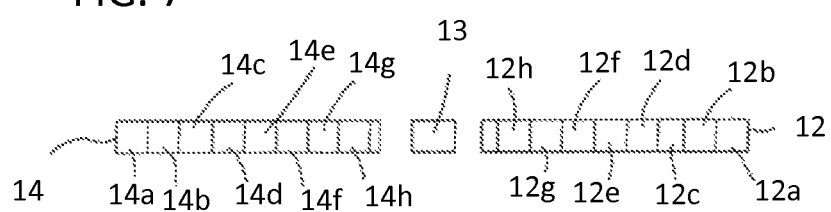
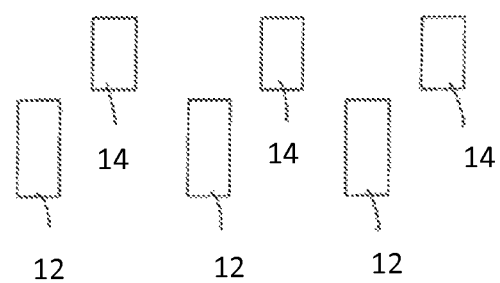
FIG. 8

PHASE-SHIFTING ELEMENT AND PARTICLE BEAM DEVICE HAVING A PHASE-SHIFTING ELEMENT

RELATED APPLICATIONS

This application is a continuation of U.S. application Ser. No. 12/931,046 filed Jan. 20, 2011 now U.S. Pat. No. 8,173,963 which is a divisional of U.S. application Ser. No. 12/070,055 filed Feb. 14, 2008 now U.S. Pat. No. 7,902,506 (issued), which are hereby incorporated by reference.

TECHNICAL FIELD

This application relates to a phase-shifting element for shifting a phase of at least a portion of a particle beam, as well as a particle beam device having a phase-shifting element of this type.

BACKGROUND OF THE INVENTION

The study of biological samples with the aid of a phase contrast has long been known in light microscopy. Using a so-called phase ring, which is situated in the back focal plane of a light microscope's objective, the radiation coming from a sample to be studied, which contains diffracted and undiffracted components, becomes phase-shifted by 90° (i.e., by $\pi/2$) in the zeroth order of diffraction. The interference of the higher orders of diffraction with the phase-shifted beam delivers a contrast-rich image (image having a phase contrast).

The use of a method of this type in electron microscopy, in particular in transmission electron microscopy, has for long not been possible. However, even in that case the use of a phase contrast study is advantageous because biological samples are basically very thin and have mostly very light-weight atoms, so that they are almost transparent for incident electrons/electron waves. Samples of this type are known as weak-phase objects. Instead of modifying the amplitude of an incident electron wave, weak-phase objects cause only a phase shift of the incident electron wave. To obtain a better phase contrast, an additional 90° (i.e., $\pi/2$) phase shift between the scattered or diffracted and the unscattered or undiffracted electrons is needed.

Some proposals have already been made to achieve a phase contrast in transmission electron microscopy.

On the one hand, it has been proposed to achieve the phase contrast in a transmission electron microscope (hereinafter referred to as TEM), which has an objective lens, by defocusing the objective lens and the spherical aberration of the objective lens. It is, however, disadvantageous here that only a spatial frequency-dependent phase shift is achieved via this procedure, so that the achieved phase contrast is also spatial frequency-dependent. Samples to be studied having very low spatial frequencies have, therefore, a very low contrast. This relationship may be described in greater detail using the phase contrast transfer function (PCTF or CTF for short) (see, for example, *Optimizing phase contrast in transmission electron microscopy with an electrostatic (Boersch) phase plate*, E. Majorovits et al, Ultramicroscopy 107 (2007) 213-226).

On the other hand, it has been proposed to use a so-called Zernike phase plate which provides a uniform phase shift of scattered or unscattered electrons for all spatial frequencies. A phase plate of this type is made of a thin carbon film, for example, which is provided with a small hole. This carbon film is situated in the back focal plane of an objective lens of a TEM. Unscattered electrons pass through the small hole of the carbon film, while scattered electrons hit the carbon film itself and may suffer a phase shift of 90° ($\pi/2$) due to a homogeneous isotropic potential (internal potential, Coulomb potential) of the carbon film. It has been found, however, that the carbon film is rapidly contaminated. In particular the small hole is easily clogged. Furthermore, it is disadvantageous that the carbon film is rapidly charged.

Furthermore, a so-called Hilbert phase plate which, like the Zernike phase plate, may also be made of a thin carbon film and causes the phase shift of a half-space, is also used for phase shifting. However, the Hilbert phase plate has the same disadvantages as the Zernike phase plate.

An alternative form of the phase shift in a TEM is achieved by using a Boersch phase plate in which an electron beam is exposed to an electrostatic potential. A design of such a Boersch phase plate is known, for example, from EP 782 170 A2. It has a ring electrode and a holding device. The ring electrode is made of an annular plate having a central opening and an outer edge. The holding device is formed by two straight supports which are situated opposite each other. In this known Boersch phase plate, the electrons unscattered or undiffracted on a sample pass through the central opening, while the scattered or diffracted electrons pass outside the annular plate. An electrostatic field which causes a phase shift of the electrons passing through the central opening is formed in the central opening. However, the known Boersch phase plate has the disadvantage that, in particular due to the support, partial beams are shadowed and prevented from contributing to the interference, so that information is lost.

Another Boersch phase plate is known from WO 03/068399 A2. This document relates to a phase plate having a ring electrode which is designed as a plate having an opening and a peripheral outer edge. Furthermore, a holding device including supports is provided. The supports are applied to the outer edge of the ring electrode and are used for positioning the ring electrode in a TEM. This known phase plate is characterized in that the holding device does not have a central symmetric design and no further support is situated on the outer edge of the plate opposite to each support with respect to the center of the opening. The known phase plate is situated in the back focal plane of an objective of a TEM. Although, due to the supports of the phase plate, a partial area of the scattered electrons is shadowed in the back focal plane of the objective, due to the non-centrally symmetrical arrangement, the scattered electrodes remain unaffected in a further partial area which is centrally symmetrical to the shadowed partial area. Due to the symmetry relationships, this phase plate allows the image information initially lost due to the shadowing by the supports to be reconstructed. The disadvantage of this known phase plate is, however, also that a partial area of the scattered electrodes is shadowed and therefore part of the image information must be reconstructed.

DE 102 00 645 A1 describes an electron microscope which also has a phase-shifting element. This phase-shifting element is ring-shaped and has a central opening, and it is therefore able to be secured at its outer periphery, so that no cantilever or almost-cantilever structures are needed.

Accordingly, it would be desirable to provide a phase-shifting element and a particle beam device having a phase-shifting element, in which components shadowing the particle beam are avoided, so that proper information content is achieved and in which the phase contrast is essentially spatial frequency-independent at zero defocus (Gauss focus).

SUMMARY OF THE INVENTION

A phase-shifting element according to a system described herein is provided for shifting the phase of at least a portion of a particle beam. It may have at least one means for generating a non-homogeneous potential which affects the particle beam. Alternatively or additionally, at least one means for generating an anisotropic potential may be provided.

It is provided, in particular, that the phase-shifting element according to the system described herein may be placed in an electron beam device, for example in a transmission electron microscope. The phase shift may be freely settable by selecting an appropriate non-homogeneous and/or anisotropic potential. For a good image contrast, a phase shift of 90° ($\pi/2$) is useful. Other phase shifts are, however, possible also in the case of the system described herein. Accordingly, the system described herein provides that the particles unscattered by an object suffer a phase shift relative to the particles scattered by the object. In other words, there is a relative phase shift between the particle beam of zeroth order of diffraction and the diffracted particle beams of a higher order of diffraction.

The phase-shifting element according to the system described herein has the advantage that interfering holding devices are no longer needed. Thus, contrary to the related art, in the case of the system described herein no portion of a particle beam is suppressed due to shadowing. A very good object signal and therefore good image information is thus obtained. In addition, the use of a non-homogeneous potential ensures that the phase contrast obtained is spatial frequency-independent at zero defocus (Gauss focus).

In a first exemplary embodiment of the phase-shifting element according to the system described herein, the means for generating a non-homogeneous potential is designed for generating a non-homogeneous electrical potential. This may be easily accomplished. Furthermore, it allows a spatial frequency-independent phase contrast to be achieved in particular. Alternatively, it is provided that the means for generating a non-homogeneous potential is provided for generating a non-homogeneous magnetic potential. The use of at least one permanent magnet, for example, is provided for this purpose. The above also applies for a corresponding anisotropic potential.

It is furthermore provided that the phase-shifting element has at least one opening which may be designed as a through opening through the material of the phase-shifting element. It should be expressly pointed out, however, that the opening does not need to be designed as a through opening. For example, embodiments of the system described herein are provided where the opening is not designed as a through opening. For example, openings are provided which are closed by a thin foil. The opening may be designed not to be rotationally symmetric in the perpendicular direction to a plane of the phase-shifting element to generate a good and highly localized non-homogeneous and/or anisotropic potential.

In another embodiment of the system described herein it is provided that the phase-shifting element has precisely one opening. The scattered or unscattered particle beams (for example, electron beams in a TEM) pass through the above-mentioned at least one opening or the precisely one opening, the unscattered particle beam (i.e., the particle beam of zeroth order of diffraction) suffering a relative phase shift with respect to the particle beams of higher order of diffraction. The interference of the particle beams of higher order of diffraction with the relatively phase-shifted particle beam provides a sufficiently good, contrast-rich image.

In particular it may be provided that the phase-shifting element has a first element dimension along a first axis and a second element dimension along a second axis, the first axis being non-parallel to the second axis. The opening of the phase-shifting element runs in this exemplary embodiment both along the first axis and along the second axis.

Furthermore, one embodiment of the system described herein is characterized in that the opening has a first opening dimension along the first axis and a second opening dimension along the second axis, the first opening dimension being greater than the second opening dimension. In particular, the first axis and the second axis define a plane (for example, the surface of the phase-shifting element) on which the opening is situated. The opening dimensions should be selected in such a way that a diffraction pattern that is to be imaged is able to pass through the opening. In a particular embodiment, the first opening dimension may be in a range of 20 µm to 200 µm, possibly in the range between 40 µm and 180 µm, and possibly in the range between 50 µm and 150 µm. The second opening dimension may be in the range between 1 µm and 20 µm and possibly between 2 µm and 5 µm.

The first axis may be perpendicular to the second axis. The phase-shifting element may also have a third axis, which is not parallel to the first axis and not parallel to the second axis, but possibly perpendicular to both the first and second axes. The opening then has a third opening dimension which extends along the third axis, the third opening dimension basically corresponding to the height of the phase-shifting element. It is basically freely selectable and may amount to between a few µm and a few mm.

It is provided in particular that the opening has a slot-shaped design. This is to be understood as a rectangular design in particular. It should be expressly pointed out that the slot-shaped design is not limited to the shape of a rectangle, but it may have any conceivable shape to achieve a slot-shaped design. In a second embodiment it is alternatively or additionally provided that the opening has a cross-shaped design.

In a further embodiment of the phase-shifting element according to the system described herein, the phase-shifting element has a multilayer design. In this case it may be provided that the phase-shifting element has at least one electrode. However, other embodiments are also provided in which more than one electrode is situated on the phase-shifting element. In an exemplary embodiment, the electrode is made of gold. Furthermore, it is connected to a control unit via at least one electrical conductor to generate a non-homogeneous and/or anisotropic potential.

In an embodiment of the system described herein, it is provided that the electrode is segmented in such a way that it is made up of individual electrode segments. The electrode segments are possibly individually controllable.

Additionally or alternatively to segmentation of a single electrode, it is provided in another embodiment of the system described herein that a separate first electrode and a separate second electrode are provided, which are also possibly individually controllable.

Furthermore it may be provided that the electrode has a first side and a second side. A first insulator is situated on the first side of the electrode. In addition, it may be provided that a second insulator is situated on the second side of the electrode. The first insulator and/or the second insulator is/are possibly made of $Al_2O_3$. In a further embodiment it is provided that a first shield unit is situated on the first insulator. In addition, a second shield unit is situated on the second insulator. The first shield unit and/or the second shield unit is/are possibly made of gold.

The above-described embodiment(s) is/are easy to implement (for example, using lithography and/or sputtering). Furthermore, they are easily controllable from the outside. It is possible in particular to control a non-homogeneous or an anisotropic potential (for example, a non-homogeneous electric potential) in such a way that a desired phase shift is obtained.

In another embodiment of the system described herein, the phase-shifting element has a drift unit. For example, it is provided that the opening of the phase-shifting element is designed as a drift unit or a drift unit is situated in the opening. The design and function of drift units have long been known, so that they will not be described in detail here.

In a further embodiment of the system described herein it is provided that the above-described phase-shifting element additionally has at least one section having an internal potential. It is thus the combination of the phase-shifting element according to the system described herein with the known related art.

The system described herein also relates to a system having at least one first phase-shifting element and at least one second phase-shifting element, both the first phase-shifting element and the second phase-shifting element having at least one of the above-mentioned features or feature combinations. In particular, it may be provided that the system has an optical axis and the first phase-shifting element and the second phase-shifting element are situated along the optical axis. In this case the second phase-shifting element is situated downstream from the first phase-shifting element.

The system described herein is of advantage in particular when a cross-shaped design of the opening of the phase-shifting element is used. This may be implemented through the system described herein by also using two phase-shifting elements connected in series and having an opening (for example, a rectangular slot) oriented in a preferred direction. The phase-shifting elements are situated in series in such a way that the preferred directions of the phase shifts are perpendicular to each other. A particle beam thus practically passes through a cross-shaped opening in two passes.

The system described herein also relates to a particle beam device which is, provided with at least one objective which has a back focal plane. Furthermore, at least one diffraction lens for enlarged imaging of the back focal plane of the objective in an intermediate diffraction pattern plane is situated on the particle beam device. At least one second diffraction lens is also provided which is situated in the intermediate diffraction pattern plane. "In the intermediate diffraction pattern plane" (here and hereinafter) is to be understood, on the one hand, as exactly in the intermediate diffraction pattern plane and, on the other hand, as near the intermediate diffraction pattern plane. The particle beam device according to the system described herein is furthermore provided with at least one multipole element and at least one phase-shifting element, which has at least one of the above-mentioned features or feature combinations and is possibly situated in the intermediate diffraction pattern plane.

The particle beam device according to the system described herein has, in addition to the above-mentioned advantages, the advantage that the back focal plane and thus the diffraction plane of the objective is imaged enlarged in the intermediate diffraction pattern plane. Accordingly, the phase-shifting element may be designed similarly enlarged, so that the phase-shifting element is more easily manufacturable due to the not very strict dimensional requirements. It is furthermore advantageous that the second diffraction lens is situated in or in the area of the intermediate diffraction pattern plane, so that the second diffraction lens has an influence, in principle, virtually only on the position of an image plane conjugated with respect to an object plane of the objective.

The enlarged image of the diffraction plane is basically linearly distorted due to the at least one multipole element. This is also known as an anamorphotic image. The enlarged image of the diffraction plane is of a different size in the directions of two mutually perpendicular axes. The ratio of the enlargement with respect to these two axes is known as aspect ratio. The aspect ratio influences and defines the dimensions of the phase-shifting element. For the system described herein, an aspect ratio in the range of 1:10 to 1:100 may be advantageous.

In one embodiment of the particle beam device according to the system described herein, the particle beam device has an optical axis. The at least one multipole element, which is used for the above-mentioned anamorphotic imaging of the diffraction plane, is situated, viewed in the direction of the second diffraction lens, away from the objective. A first multipole element and a second multipole element are possibly provided, the first diffraction lens, the first multipole element, the second multipole element, and the intermediate diffraction pattern plane being situated in the direction of the second diffraction lens away from the objective. A good anamorphotic imaging of the diffraction plane is ensured due to the above-described exemplary embodiment.

In a further embodiment, a third multipole element, a fourth multipole element, and a projective lens are also situated on the particle beam device according to the system described herein, the third multipole element, the fourth multipole element, and the projective lens being situated in the direction of the projective lens away from the intermediate diffraction pattern plane. The particle beam device may also have a fifth multipole element in the area of the intermediate diffraction pattern plane, which is advantageously split into a first submultipole element and a second submultipole element. The above-mentioned arrangement of multipole elements ensures that the anamorphotic imaging is compensated again, i.e., is canceled. Furthermore, the split into two sub-multipole elements is advantageous in particular during assembly because the phase-shifting element must be situated in the area of the intermediate diffraction pattern plane and the split ensures better access.

In an embodiment of the system described herein, the multipole element or at least one of the multipole elements is provided with at least one magnetic or electric pole. Depending on the number of poles, desired fields that are required for anamorphotic imaging may be generated. The multipole element or at least one of the multipole elements may have a quadrupole field. In particular it is provided that the multipole element or at least one of the multipole elements is designed as a quadrupole element.

It is furthermore advantageous to superimpose a dipole field on each quadrupole element, so that biaxial double deflection systems are formed by two adjacent quadrupole elements.

In a further exemplary embodiment, the particle beam device has at least six quadrupole elements, which are excitable antisymmetrically to the intermediate diffraction pattern plane, an octupole being superimposed on each quadrupole element and on the intermediate diffraction pattern plane. An arrangement of this type of quadrupole elements and octupoles is known from DE 42 04 512 A1, but not in the context of a phase-shifting element. This exemplary embodiment ensures, on the one hand, anamorphotic imaging of the diffraction plane, the phase-shifting element being situated in the image, and, on the other hand, correction of opening errors and chromatic errors in the particle beam device.

In a further exemplary embodiment of the particle beam device according to the system described herein, the particle beam device has at least one quadrupole septuplet containing six quadrupole elements, the quadrupole elements being excitable symmetrically to the intermediate diffraction pattern plane, and at least five octupoles excitable within the quadrupole septuplet. Such an arrangement is known from DE 101 59 454 A1, but not in the context of a phase-shifting element. This exemplary embodiment again ensures; on the one hand, anamorphotic imaging of the diffraction plane and, on the other hand, correction of opening errors and chromatic errors of the particle beam device.

As mentioned previously, in an embodiment, the quadrupole element or at least one of the quadrupole elements has an electrical or magnetic design. It is also possibly provided that at least one of the octupoles has an electrical and/or magnetic design.

One embodiment of the particle beam device also provides that the particle beam device is provided with a corrector for correction of aberrations, which may be designed as described above. It may be provided that the multipole element (in particular the above-described system of quadrupole elements) may be situated upstream and/or downstream from the corrector with respect to a beam direction of the particle beam device. This exemplary embodiment ensures that in the case of imaging in the Gauss focus, a zero-position-free contrast transmission is implemented. The absolute value of the phase contrast transfer function varies between the absolute value 1 (i.e., optimum phase contrast at 90° phase shift) and 0.707 (45°).

The particle beam device according to the system described herein may be designed as an electron beam device, in particular as a TEM.

The system described herein also relates to a particle beam device having at least one objective which has a back focal plane, and at least one first diffraction lens for imaging the back focal plane of the objective in an intermediate diffraction pattern plane. Furthermore, at least one second diffraction lens is provided, which is situated in or in the area of the intermediate diffraction pattern plane. At least one phase-shifting element and at least one multipole element designed as a quadrupole element are also situated on the particle beam device. The phase-shifting element may have one of the above-mentioned features or feature combinations, but is not limited thereto. Also in the case of this particle beam device, the diffraction plane is imaged, so that the phase-shifting element may be designed appropriately enlarged geometrically. This ensures, on the one hand, easy manufacturing of the phase-shifting element and, on the other hand, reduction of suppression of particles of a particle beam by components (for example, holding frames) of the phase-shifting element as known from the related art.

BRIEF DESCRIPTION OF THE DRAWINGS

Exemplary embodiments of the system described herein are described below in greater detail with reference to the following figures:

FIG. 7 shows a schematic illustration of a segmented electrode;

FIG. 8 shows a schematic illustration of a comb-like arrangement of electrodes;

DETAILED DESCRIPTION OF VARIOUS EMBODIMENTS

Figure 1:
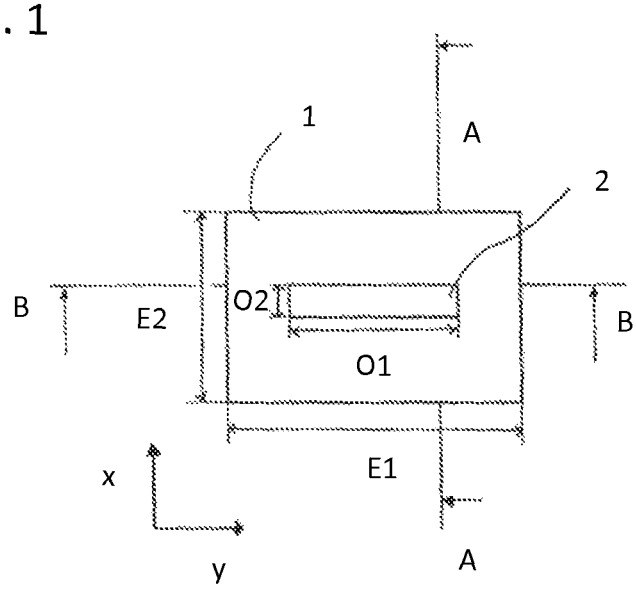
FIG. 1 shows a top view onto a phase-shifting element in the form of a phase plate.

The system described herein is based on the recognition that a desired phase shift is achievable using simple geometric designs with the help of a non-homogeneous and/or anisotropic potential, in particular a non-homogeneous electric potential. FIG. 1 shows a top view of a first exemplary embodiment of a phase-shifting element 1 in the form of a phase plate in which a non-homogeneous potential or an anisotropic potential is generated. Phase-shifting element 1 is situated in the beam path of a particle beam device (for example, an electron beam device in the form of a TEM) in such a way that the optical axis of the particle beam device runs in the z direction, which is perpendicular to the plane of the page on which FIG. 1 is printed.

Phase-shifting element 1 has a first dimension E1 in the y direction and a second dimension E2 in the x direction. In principle, the phase plate has a rectangular design in this exemplary embodiment. It should be expressly pointed out that the system described herein is not limited to a rectangular design of the phase plate. Rather, the phase plate may have any conceivable shape. For example, it may also have a round design.

Phase-shifting element 1 is provided with a rectangular through opening in the form of a slot 2 approximately in the center. Slot 2 has a first dimension O1 in the y direction and a second dimension O2 in the x direction. Dimension O1 is approximately 60 µm in the exemplary embodiment illustrated here. Dimension O2 is approximately 2 µm to 3 µm.

Figure 2:
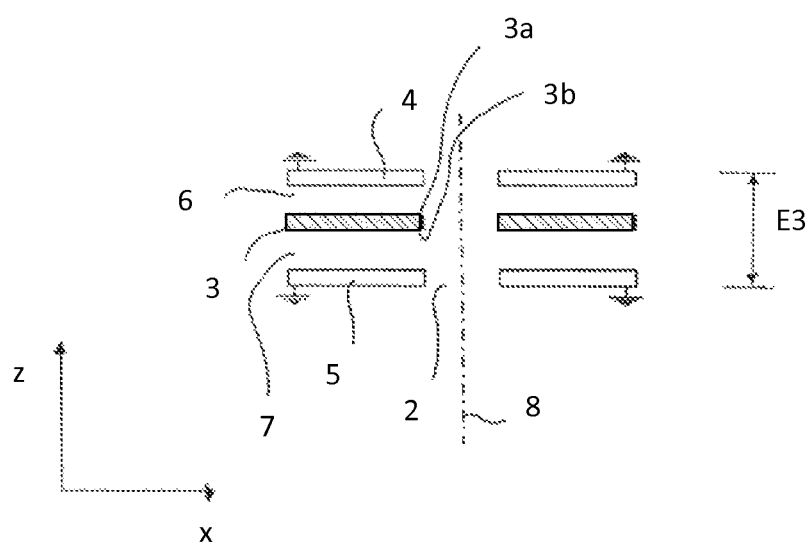
FIG. 2 shows a sectioned view of the first phase-shifting element along line A-A in FIG. 1.

FIG. 2 shows a schematic illustration of a sectioned view of phase-shifting element 1 along line A-A in FIG. 1. Phase-shifting element 1, having a multilayer design, has a third dimension E3 in the z direction, along which slot 2 fully extends. Phase-shifting element 1 furthermore has a central electrode 3, which is made of gold and which is provided with a first side 3a and a second side 3b. An insulator layer 6 is situated on first side 3a. Furthermore, an insulator layer 7 is situated on second side 3b. Both insulator layer 6 and insulator layer 7 are made of $Al_2O_3$. Insulator layers 6 and 7 are in turn provided with a shield layer 4 and 5, respectively. Both shield layer 4 and shield layer 5 are made of gold and are at the potential of the surroundings. They are grounded, for example.

An axis, which in FIG. 1 runs in the z direction, is provided with the reference numeral 8 in FIG. 2. The axis runs through slot 2. Central electrode 3 is controllable with the aid of an electronic unit (control unit, not illustrated) in such a way that a non-homogeneous electric potential is obtained in slot 2. The scattered and unscattered particle beams (for example, electron beams in a TEM) pass through slot 2, the unscattered particle beam (i.e., the particle beam of zeroth order of diffraction) suffering a relative phase shift with respect to the particle beams of higher order of diffraction. The interference of the particle beams of higher order of diffraction with the relatively phase-shifted particle beam provides a sufficiently good, contrast-rich image.

Figure 3:
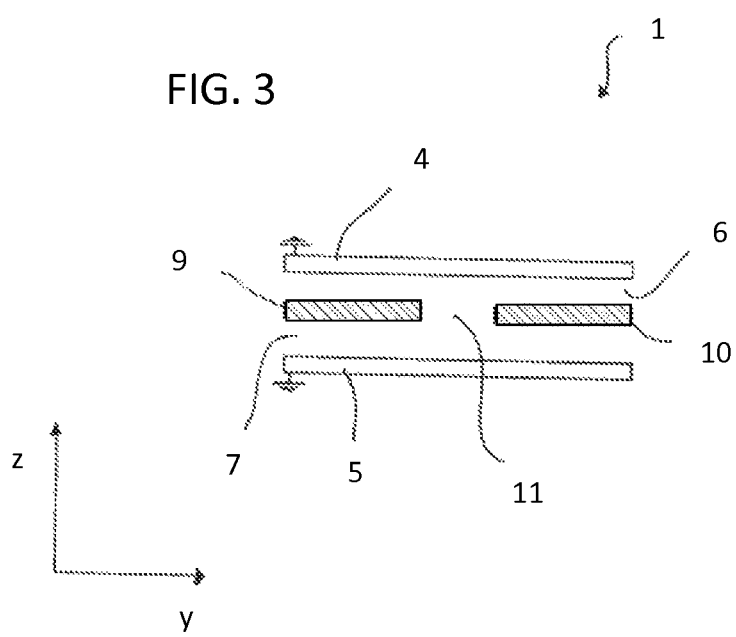
FIG. 3 shows a sectioned view of the first phase-shifting element along line B-B in FIG. 1.

FIG. 3 shows a section along line B-B in FIG. 1. Central electrode 3 again has two individually controllable electrodes 9 and 10, which are surrounded by an insulator layer 6 and an insulator layer 7. Furthermore, both electrodes 9 and 10 are isolated from each other by an insulator layer 11. Also in this exemplary embodiment, insulator layers 6, 7, and 11 are made of $Al_2O_3$. Insulator layers 6 and 7 are in turn provided with shield layers 4 and 5, respectively, which are made of gold and are at the potential of the surroundings (for example, grounded).

Figures 5A, 5B:
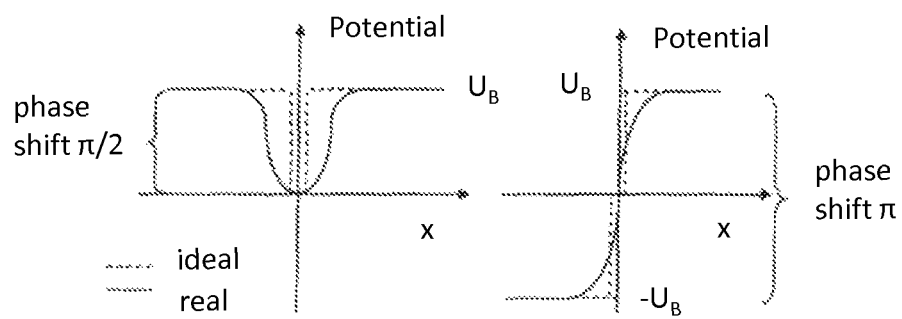
FIGS. 5a,b show schematic illustrations of distributions of a non-homogeneous potential for phase shifting.

A first potential $(-U_B)$ is generated on electrode 9 via an electronic unit (control unit, not illustrated), while a second potential $(U_B)$ is generated on electrode 10. The variation of the potential is shown in FIG. 5b. It is apparent that an undiffracted particle beam passing through slot 2 suffers a phase shift of 180° (i.e., $\pi$) with respect to the diffracted particle beams of higher order of diffraction passing through slot 2. The exemplary embodiment shown in FIG. 3 is used for the Hilbert phase shift and is therefore designed as a Hilbert phase plate.

Figure 4:
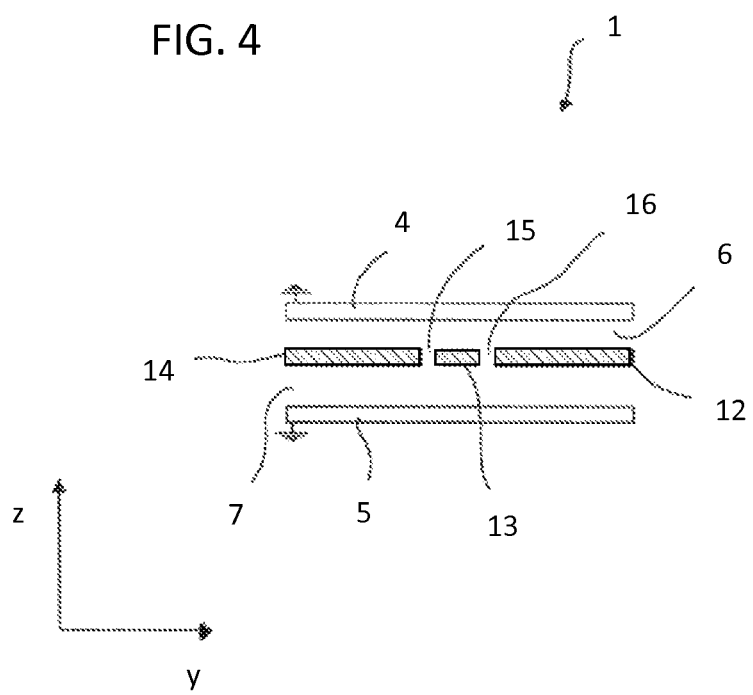
FIG. 4 shows a sectioned view of a second phase-shifting element and a top view according to FIG. 1, the section being along line B-B.

FIG. 4 shows another exemplary embodiment of a phase-shifting element 1 in a multi-layer design according to the system described herein in the form of a phase plate. The same reference numerals are used for the same elements as in the previously described exemplary embodiments. In top view, this phase-shifting element 1 has the same design as the exemplary embodiment illustrated in FIGS. 1 and 2. Accordingly, it also has slot 2. However, considering a sectional view along line B-B of the further exemplary embodiment, it is apparent that it has a somewhat different design from that of the exemplary embodiment of FIG. 3. In the exemplary embodiment of FIG. 4, electrode 3 is formed by three electrodes 12, 13, and 14 made of gold, which are separated from each other with the aid of insulator layers 15 and 16 made of $Al_2O_3$. As an alternative, the insulator layers may be formed by vacuum. Additional insulator layers 6 and 7 made of $Al_2O_3$ are situated on the sides of electrodes 12 through 14, which are also provided with shield layers 4 and 5 made of gold and being at the potential of the surroundings (for example, grounded).

Potentials are again generated via an electronic unit (control unit, not illustrated) in such a way that a potential $U_B$ is applied to electrodes 12 and 14, while a potential $U_0$ is applied to electrode 13. The variation of the potential is shown in FIG. 5a. It is apparent that an undiffracted particle beam passing through slot 2 suffers a phase shift of 90° (i.e., $\pi/2$) with respect to the diffracted particle beams of higher order of diffraction passing through slot 2. The exemplary embodiment shown in FIG. 4 is used for the Zernike phase shift and is therefore designed as a Zernike phase plate.

Figure 6:
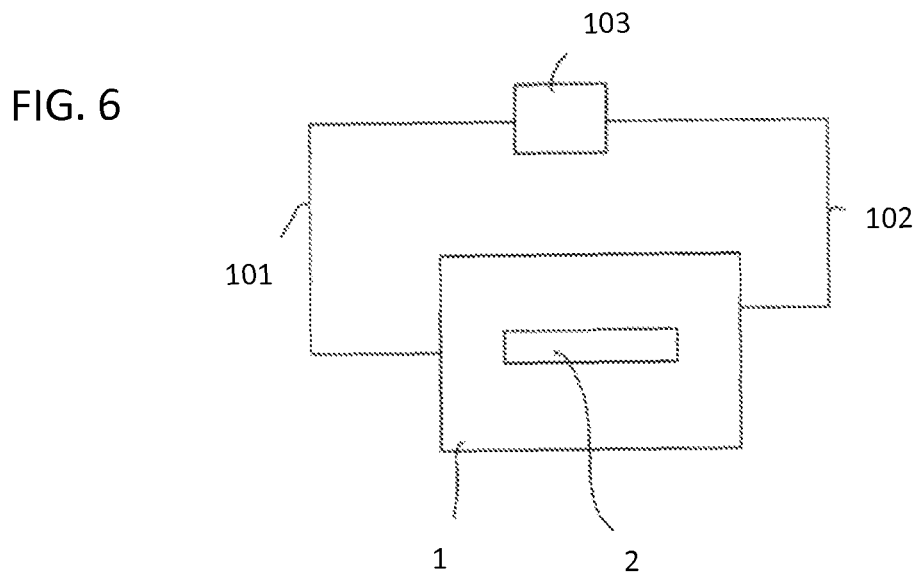
FIG. 6 shows a schematic illustration of a control unit connected to the phase-shifting element.

FIG. 6 shows the system of phase-shifting element 1 of FIGS. 1, 2, 3, and 4, and a control unit 103, which is connected to phase-shifting element 1 via lines 101 and 102. The above-mentioned electrodes are individually controllable with the aid of control unit 103 for generating the desired potential.

FIGS. 7 and 8 show further embodiments of electrodes which may be implemented on phase-shifting element 1 according to the system described herein. FIG. 7 shows a central electrode 13 and two segmented electrodes 12 and 14 spaced therefrom by insulators. Electrode 12 thus has segments 12a through 12h insulated from each other, while electrode 14 has segments 14a through 14h insulated from each other. Each individual segment is individually controllable. They are basically each connected to control unit 103, as in FIG. 6.

FIG. 8 shows another embodiment of the electrodes. In this embodiment, electrodes 12 and 14 have a comb-like structure.

Figure 9:
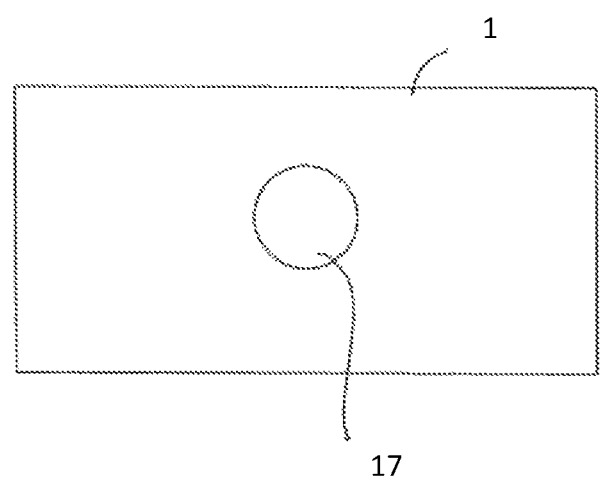
FIG. 9 shows a top view onto another phase-shifting element.

FIG. 9 shows another exemplary embodiment of phase-shifting element 1 according to the system described herein having a circular opening 17.

Figure 10:
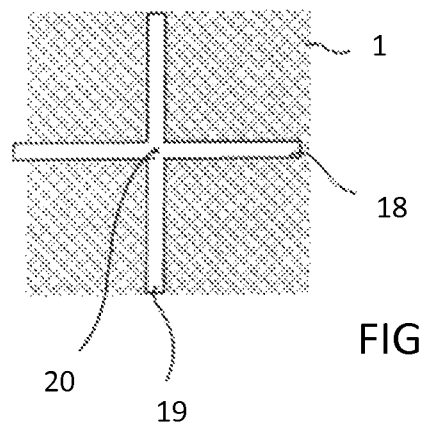
FIG. 10 shows a top view onto another phase-shifting element having a cross-shaped opening.

FIG. 10 shows another exemplary embodiment of a phase-shifting element 1. It is provided with two rectangular slots 18 and 19, which are at a right angle to each other. The two slots 18 and 19 thus form a cross, through whose center 20 the undiffracted particle beam passes. The multilayer construction of this phase-shifting element 1 is in principle the same as the construction according to FIG. 3 or 4. This specific embodiment also ensures that a non-homogeneous electric potential is provided, so that the undiffracted particle beam receives a relative phase shift impressed on it with respect to the particle beams of higher order of diffraction. A cross phase contrast is produced due to the cross-shaped design.

Figure 12A:
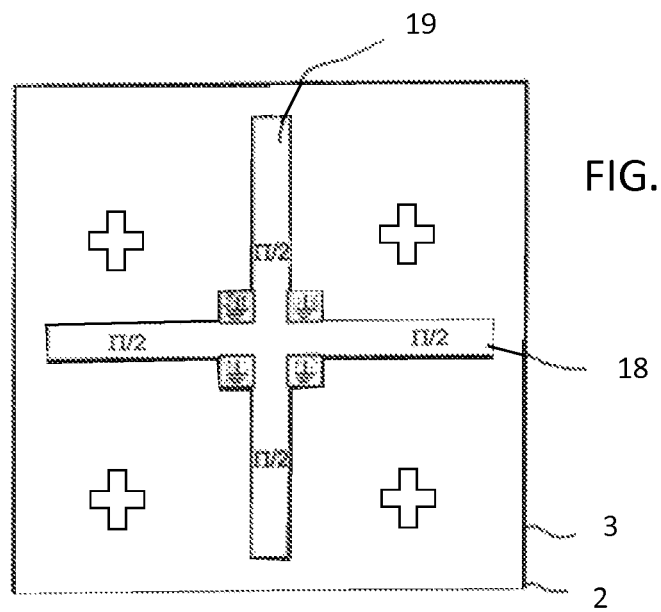
FIGS. 12a,b show schematic illustrations of two phase-shifting elements having cross-shaped openings.

FIG. 12a shows another illustration of a phase plate 2 having two cross-shaped slots 18 and 19. Only electrode 3 (central electrode), which is at positive potential, is illustrated here. The 4 internal quadrants are grounded, or a slightly negative voltage is applied to them for generating a zero potential on the optical axis. A potential for a relative phase shift of $\pi/2$ is generated in slots 18 and 19.

Figure 12B:
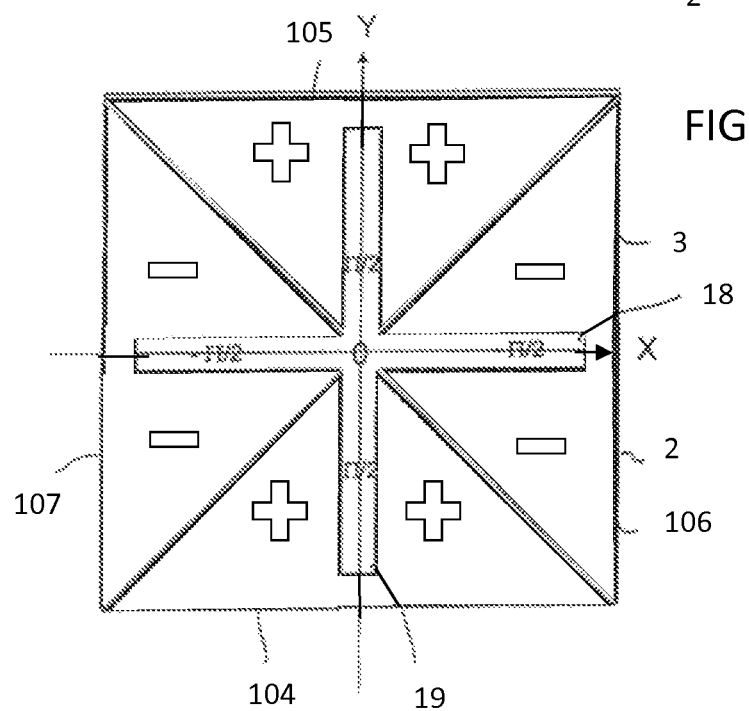

FIG. 12b shows another illustration of a phase plate having cross-shaped slots 18 and 19. In this exemplary embodiment, electrodes 104 and 105 are at a positive potential, while electrodes 106 and 107 are at a negative potential. A potential for a relative phase shift is again generated in slots 18 and 19. The potential in the X section produces a relative phase shift of $-\pi/2$, while the potential in the Y section produces a relative phase shift of $\pi/2$. Since in the X section the potential is negative in the distant wave zone and in the Y section it is positive in the distant wave zone, a zero crossing of the potential on the optical axis is achieved.

Figure 11:
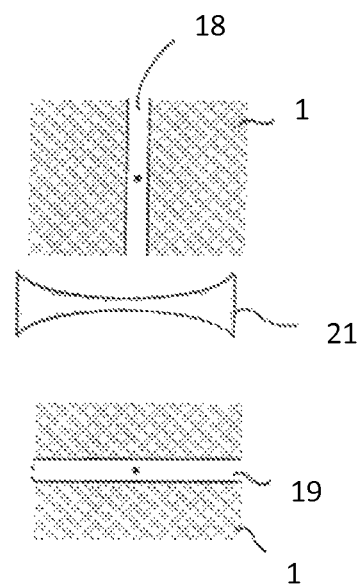
FIG. 11 shows a schematic illustration of a system of two phase-shifting elements.

A good non-homogeneous electric potential is generated and a sufficiently good phase shift is ensured also by an embodiment which is schematically illustrated in FIG. 11. In this exemplary embodiment, two phase-shifting elements 1 in the form of phase plates are used, each of which has a slot-shaped opening 18 and 19, respectively. The two phase-shifting elements 1 are connected in series in a particle beam device (for example, a TEM), a quadrupole optical system 21 being situated between the two phase-shifting elements 1. The two phase-shifting elements 1 are situated with respect to each other in such a way that the two slot-shaped openings 18 and 19 are perpendicular to each other. The two phase-shifting elements 1 provide a non-homogeneous electric potential in such a way that after a particle beam passes through openings 18 and 19, the undiffracted portion of the particle beam suffers a phase shift with respect to the diffracted portion of the particle beam, a crossed phase contrast again being achieved through the serial connection of the two phase-shifting elements 1.

Figure 13:
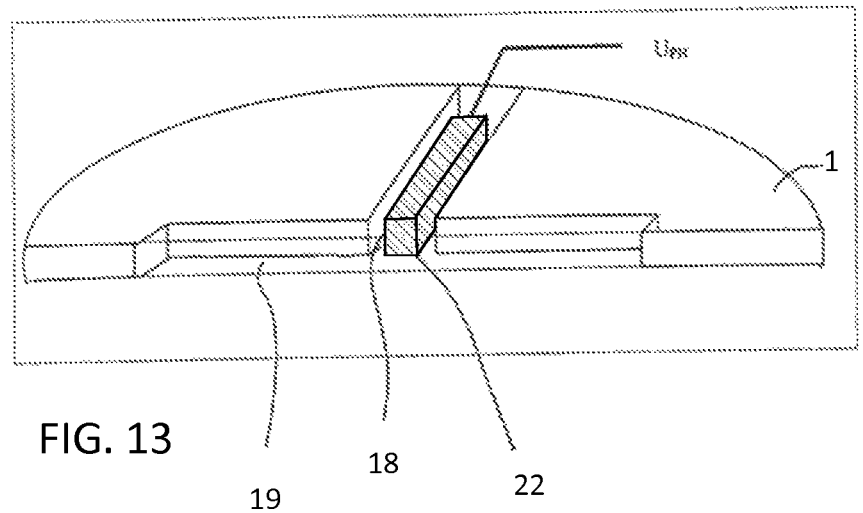
FIG. 13 shows a schematic illustration of another phase-shifting element in a drift unit design.

FIG. 13 shows another exemplary embodiment of phase-shifting element 1 in the form of a phase plate. FIG. 13 is a schematic view of one-half of phase-shifting element 1, which is again provided with slot-shaped openings 18 and 19, which are arranged in a cross shape. An electrode is situated in opening 18, which forms a drift unit 22 with an opposite electrode (not illustrated), which is surrounded by an insulator layer of vacuum or $Al_2O_3$. Drift unit 22 is designed for providing a non-homogeneous electric potential and therefore also causes the diffracted particle beam to suffer a relative phase shift with respect to the undiffracted particle beam.

Figure 14:
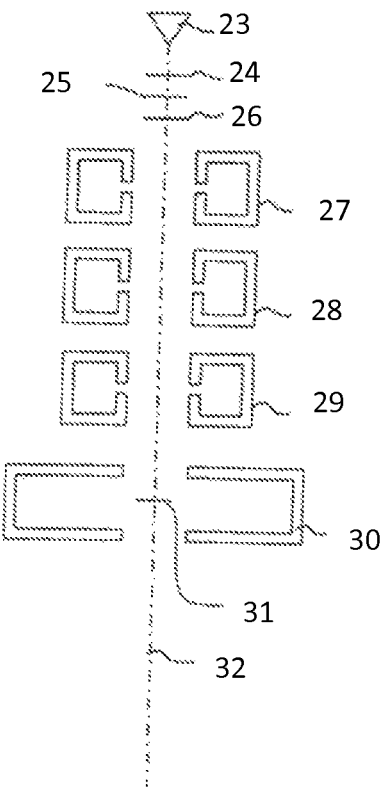
FIG. 14 shows a schematic illustration of a top part of a TEM.

FIG. 14 shows the top part of a TEM whose bottom part will be described in greater detail below. The TEM has an electron source 23 in the form of a thermal field emission source. However, another electron source may, of course, also be used. An extraction electrode 24, whose potential extracts electrons from electron source 23, is situated along optical axis 32 of the TEM downstream from electron source 23. Furthermore, an electrode 25 for focusing the source position and at least one further electrode 26 for acceleration are provided. Due to electrode 26, the electrons exiting from electron source 23 are accelerated with the aid of an electrode voltage to a desired and settable energy. A design of this type has long been known and will not be discussed further in detail.

A multistage condenser having three magnetic lenses 27 through 29, followed by an objective 30, is situated further along optical axis 32. An object plane 31, on which a sample to be studied may be placed with the aid of a sample manipulator, is situated on objective 30. The electron source is focused onto the back focus plane of objective 30.

Figure 15A:
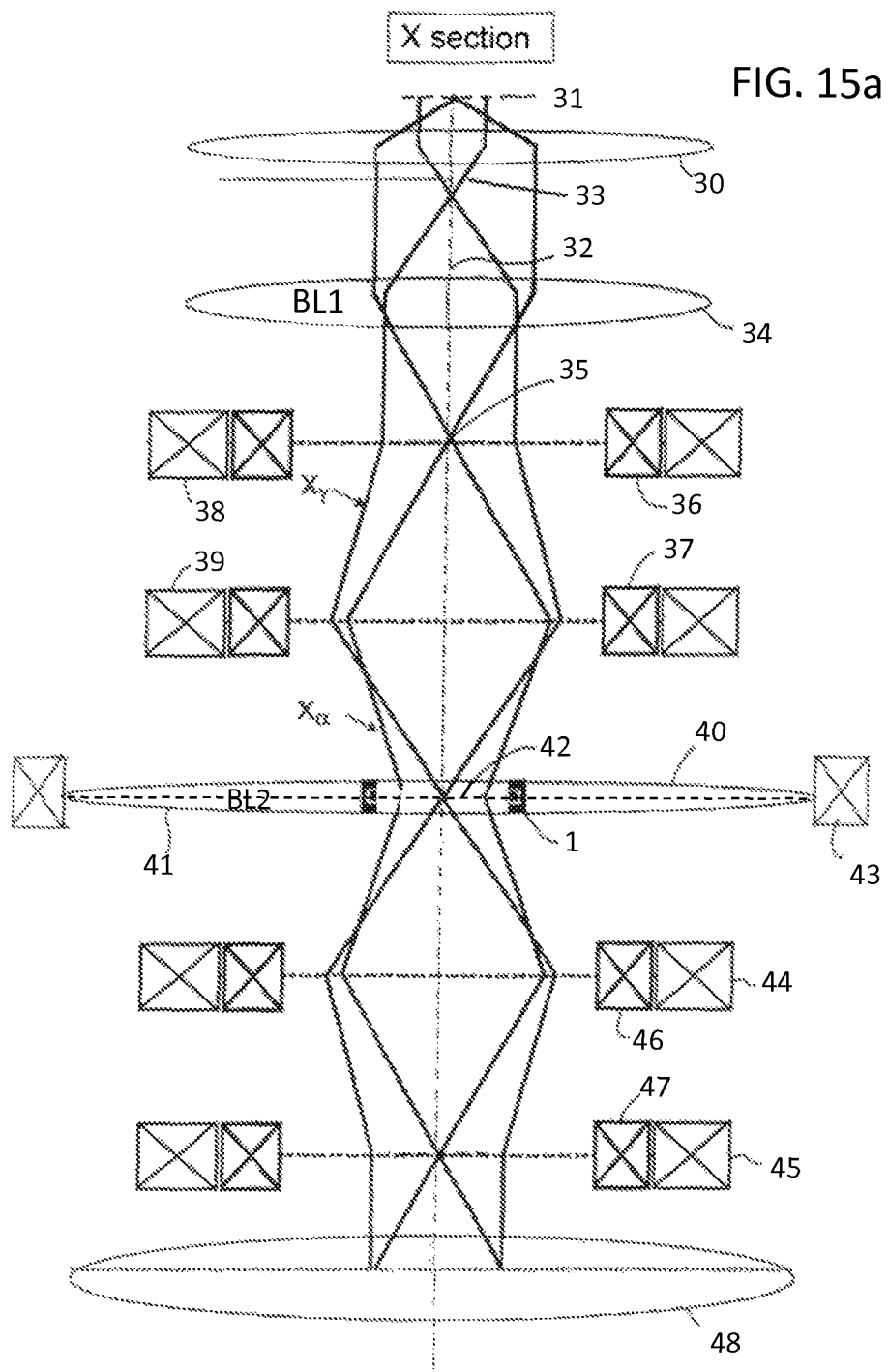
FIGS. 15a,b show schematic illustrations of a bottom part of a TEM having a phase-shifting element.
Figure 15B:
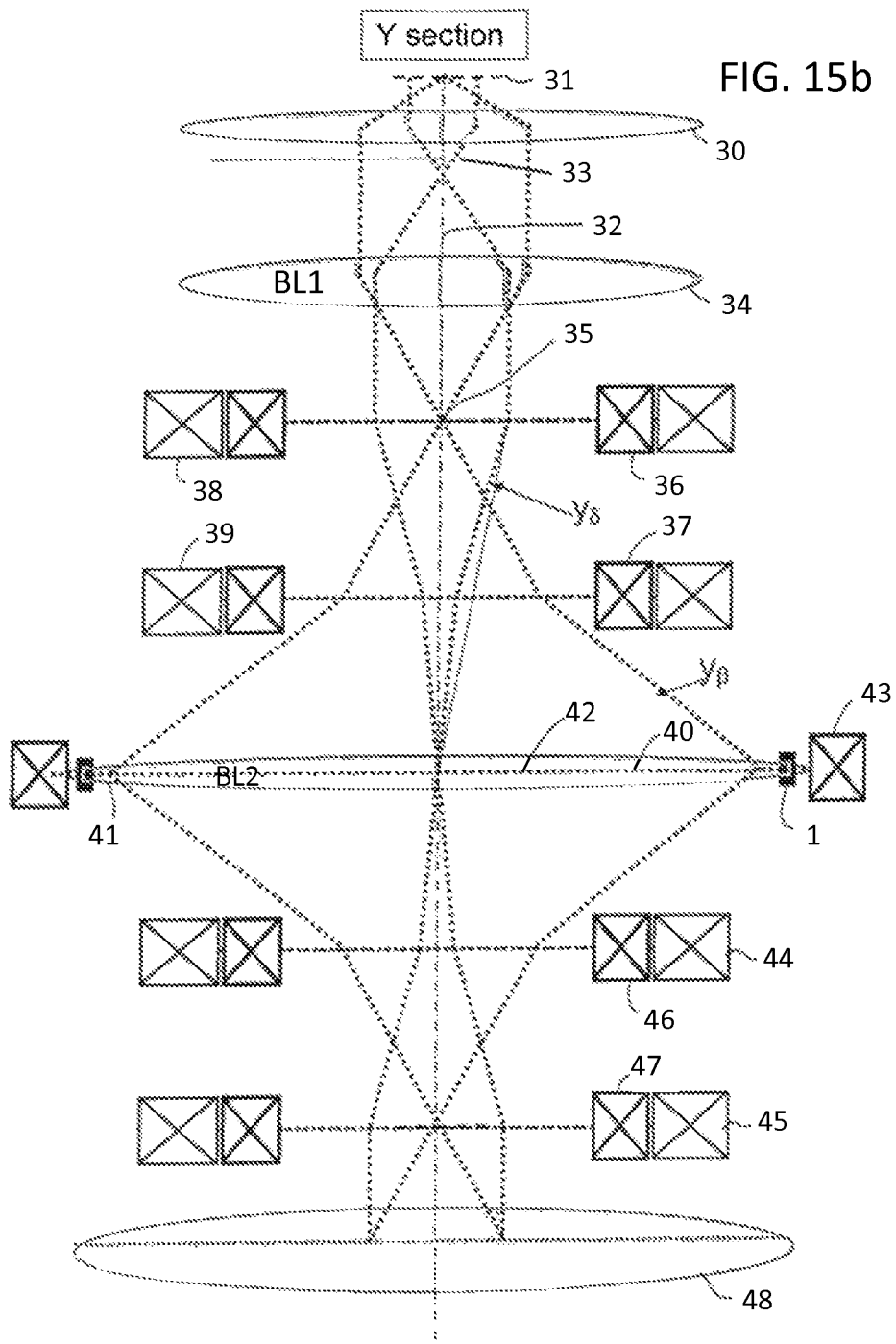

FIGS. 15*a* and 15*b* show the bottom part of the TEM, which has a system for anamorphotic imaging of a diffraction plane using a multipole system. FIG. 15*a* shows the X section (i.e., the section along the X axis), and FIG. 15*b* shows the Y section (i.e., the section along the Y axis). Objective 30 according to FIG. 14 is followed by a first diffraction lens 34 along optical axis 32 of the TEM. It is followed by a first quadrupole element 36 and a second quadrupole element 37. For adjustment purposes, quadrupole element 36 is associated with a deflector system 38, while quadrupole element 37 is associated with a deflector system 39. The two deflector systems 38 and 39 have a dipole field. A second diffraction lens 41 is situated in intermediate diffraction pattern plane 40, the main plane of second diffraction lens 41 corresponding to intermediate diffraction pattern plane 40. Phase-shifting element 1, which in the exemplary embodiment illustrated here is one of the above-mentioned phase-shifting elements 1, is also situated in the main plane of second diffraction lens 41. For example, it is phase-shifting element 1 according to FIGS. 1, 2, and 3. A quadrupole element 43 is also situated in the area of the main plane of second diffraction lens 41. Further quadrupole elements are provided further along optical axis 32. Thus, second diffraction lens 41 is followed by a quadrupole element 46 and a quadrupole element 47. Each quadrupole element 46 and 47 is associated with a deflector system 44 and 45, each of which in turn has a dipole field. Quadrupole element 47 is followed by a projective lens 48 along optical axis 32.

The operation of the TEM according to FIGS. 14, 15*a*, and 15*b* is described in greater detail below. Anamorphotic images such as produced by the TEM illustrated here are produced by multipole systems which may be described by 4 fundamental paths. These are paths $x_\alpha$, $y_\beta$, $x_\gamma$ and $y_\delta$. The fundamental path which begins in the plane of the image (i.e., object plane 31) on optical axis 32 in the X section (imaging beams) is labeled $x_\alpha$. The corresponding Y section is labeled $y_\beta$. The fundamental path which begins (field beams) under a certain angle in diffraction plane 33, which corresponds to the back focal plane of objective 30, is labeled $x_\gamma$ in the X section and $y_\delta$ in the Y section. The paths satisfy the equations of the set:

$$x'_\alpha \cdot x_\gamma - x_\alpha \cdot x'_\gamma = 1$$

$$y'_\beta \cdot y_\delta - y_\beta \cdot y'_\delta = 1$$

where the apostrophized quantities stand for the derivatives (slopes) of the paths. The set of equations has long been known, so that it is not discussed in greater detail here.

The object to be studied is in the focal point of objective 30, so that a parallel bundle of imaging beams exits objective 30. The bundle of imaging beams is focused in first intermediate image 35 with the aid of first diffraction lens 34. The front (object-side) focal plane of first diffraction lens 34 is in the back focal plane, i.e., diffraction plane 33 of objective 30, so that the field beams exit first diffraction lens 34 as parallel beams. Quadrupole element 36 is situated in the area of intermediate image 35 in such a way that it does not influence the imaging beams. However, the field beams are defocused ($x_\gamma$) or focused ($y_\delta$) by first quadrupole element 36. A focused, stigmatic image of diffraction plane 33 is obtained in connection with the other quadrupole element 37. The imaging beams are not influenced by quadrupole element 36, but they are influenced by quadrupole element 37; they are defocused in one direction (namely $y_\beta$) and focused in the direction perpendicular thereto ($x_\alpha$). In this way, a diffraction pattern of diffraction plane 33 having different enlargements in the two image sections X and Y is obtained in intermediate diffraction pattern plane 40 (which is a plane of symmetry). An anamorphotic (i.e., linearly distorted) diffraction pattern is thus obtained. With the condition for a focused diffraction pattern $$x_\gamma(ZS) = y_\delta(ZS) = 0,$$

where ZS corresponds to intermediate diffraction pattern plane 40, the paths and slopes of the paths must satisfy the following equations:

$$x_\alpha(ZS) \cdot x'_\gamma(ZS) = -1$$

$$y_\beta(ZS) \cdot y'_\delta(ZS) = -1$$

The ratio of $y_\beta$ and $x_\alpha$ in intermediate diffraction pattern plane 40 (ZS) is the aspect ratio, which in the exemplary embodiment illustrated here is in the range of 1:10 to 1:100. The aspect ratio defines the dimensions of phase-shifting element 1, which is designed as a rectangle having slot 2. The dimension of slot 2 is selected in such a way that at least part of, or even all, the diffraction pattern of back focal plane 33 passes through slot 2. In other words, the unscattered or undiffracted particle beam of zeroth order, together with at least some scattered or diffracted particle beams of higher orders of diffraction, passes through slot 2.

The use of the combination of phase-shifting element 1 with anamorphotic imaging has the advantage that interfering holding devices are no longer needed for phase-shifting element 1. Thus, contrary to the related art, in the case of the system described herein, no portion of a particle beam is suppressed due to shadowing. A good signal and therefore good image information is thus obtained. In addition, the use of a non-homogeneous potential ensures that the phase contrast obtained remains spatial frequency-independent.

Further down the TEM beam path, the anamorphotic image is compensated again. Quadrupole elements 43, 46, and 47 are used for this purpose. Second diffraction lens 41 and quadrupole elements 43, 44, and 45 influence imaging beams $x_\alpha$ and $y_\beta$ in such a way that they run mirror-symmetrically to the anamorphotic diffraction plane, but the field beams, which are focused in the plane of symmetry, pass through the plane of symmetry unaffected. In contrast, field beams $x_\gamma$ and $y_\delta$ run antisymmetrically to the plane of phase-shifting element 1. Due to the existing symmetry conditions, quadrupole elements 46 and 47 situated below intermediate diffraction pattern plane 40, on which again a dipole field is superimposed by deflector systems 44 and 45, compensate the anamorphism of the beam path.

Instead of phase-shifting element 1, which has a design according to FIGS. 1, 2, and 3, a phase-shifting element 1 having a cross-shaped opening (for example, FIG. 10) may also be situated in intermediate diffraction pattern plane 40. Using a suitable connection of the quadrupole elements, the anamorphotic image of diffraction plane 33 may be rotated by 90°. Thus even the diffracted particle beams, which run perpendicular to the gap, may subsequently be phase shifted.

Figure 16A:
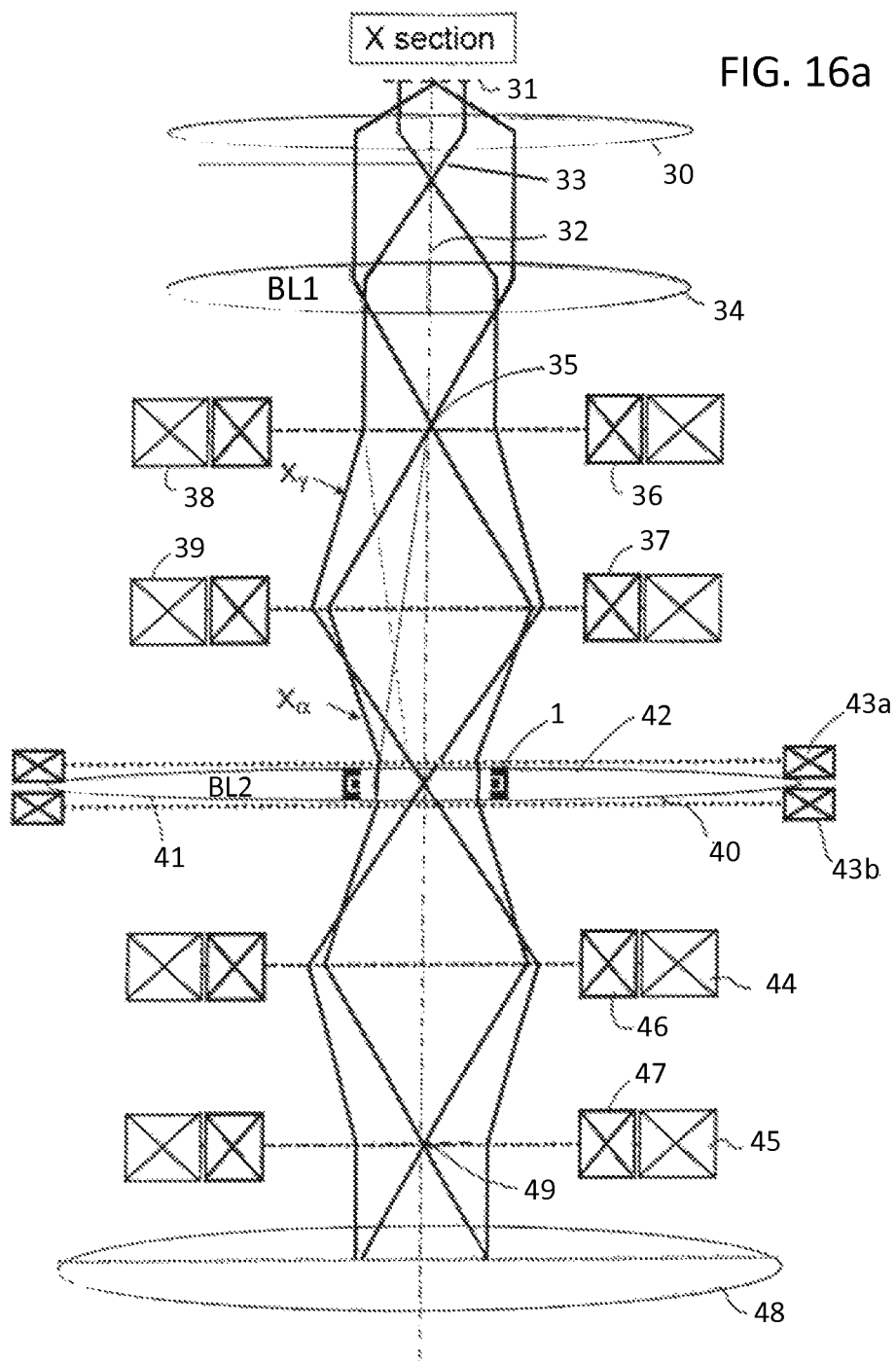
FIGS. 16a,b show schematic illustrations of a bottom part of a TEM modified with respect to FIGS. 15a, b having a phase-shifting element.
Figure 16B:
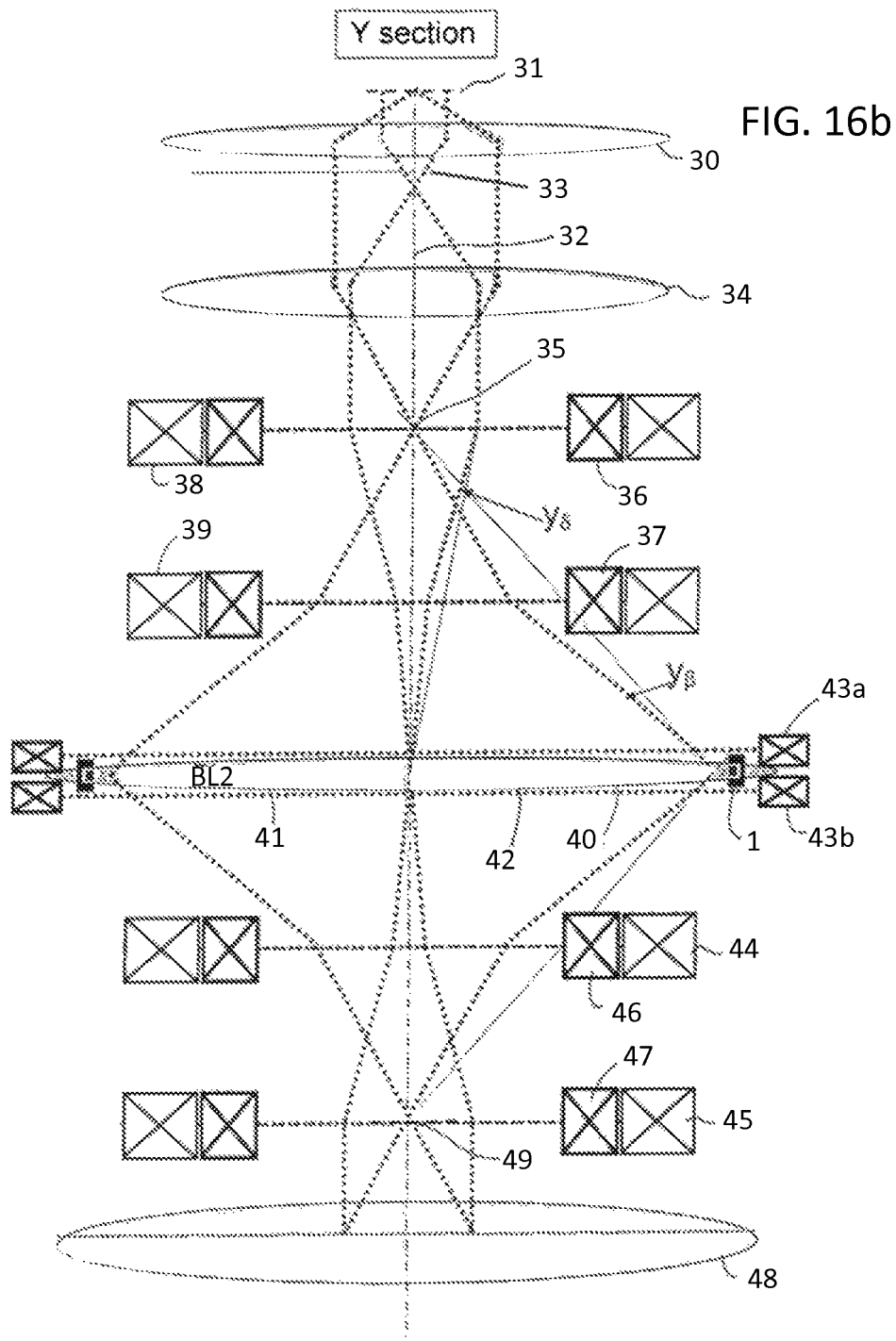

FIGS. 16a and 16b show a bottom part, which is almost identical to FIGS. 15a and 15b, of a TEM, which, however, is provided with a submultipole element in the form of a quadrupole element 43a and a submultipole element in the form of a quadrupole element 43b in the area of intermediate diffraction pattern plane 40. The split of quadrupole element 43 shown in FIGS. 15a and 15b into two quadrupole elements 43a and 43b is advantageous from the point of view of assembly, because it facilitates placing phase-shifting element 1 in the beam path of the TEM using manipulators. The function of quadrupole elements 43a and 43b is elucidated below.

Quadrupole element 43a causes imaging beam $y_\beta$ to be slightly focused, and imaging beam $x_\alpha$ to be slightly defocused, so that they have a shared virtual imaging plane which is situated in intermediate image 35. This imaging plane is formed by second diffraction lens 41 in intermediate image plane 49. Quadrupole element 43b thus operates similarly to quadrupole element 43a and causes the imaging beams to be focused or defocused.

Figure 17:
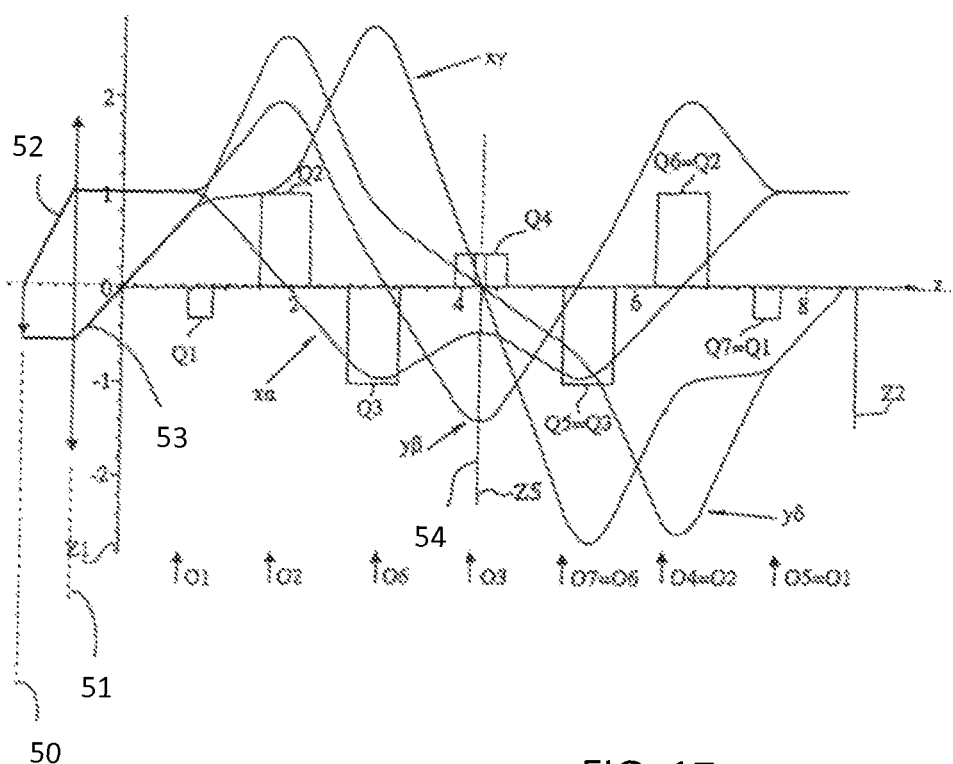
FIG. 17 shows a schematic illustration of a beam path in a bottom part of a TEM having multipole elements.

FIG. 17 shows another exemplary embodiment of an imaging system in a TEM, which basically combines three things, namely a phase-shifting element, an anamorphotic image of a diffraction plane, and a color and error correction.

In this exemplary embodiment, the objective, i.e., the objective plane, is labeled with reference numeral 50 in FIG. 17, while the back focal plane, i.e., the diffraction plane, of objective 50 is labeled with reference numeral 51. Furthermore, a number of multipole elements in the form of quadrupoles and octupoles are situated in the beam path along the optical axis of the TEM oriented in the z direction. FIG. 17 basically shows the positions and intensities of the quadrupoles situated along optical axis z, i.e., of their quadrupole fields Q1 through Q7. Quadrupoles Q1 through Q7 are situated symmetrically to central plane of symmetry ZS, which is, at the same time, the intermediate diffraction pattern plane and in which a phase-shifting element 54 is situated. Phase-shifting element 54 has a structure according to FIGS. 1, 2, and 3.

Plane of symmetry ZS is a plane of symmetry with respect to both the quadrupole fields and the fundamental paths. Quadrupoles Q1 through Q7 have an electric-magnetic design. They are made of superposed mutual electrostatic and magnetic quadrupole fields. Image paths 52, i.e., the paths starting in object plane 50 at a certain angle and labeled $x_\alpha$ and $y_\beta$, run symmetrically to plane of symmetry ZS. Field paths 53, i.e., the paths which start at a certain angle in diffraction plane 51 and labeled $x_\gamma$ and $y_\delta$, run antisymmetrically to plane of symmetry ZS. Back diffraction plane 51 is anamorphotically imaged in plane of symmetry ZS, i.e., imaged linearly distorted, as has been basically described for the exemplary embodiments of FIGS. 15a,b and 16a,b.

The exemplary embodiment of FIG. 17 also has five octupoles O1 through O5. Octupoles O1 through O5 are indicated with appropriate arrows. The positions of the individual octupoles O1 through O5 along optical axis z are selected with respect to the fundamental paths in such a way that components of the opening error of the objective may be corrected. One octupole pair is situated at points at which the beam is largely rotation-symmetric such as in areas upstream from first quadrupole Q1 and downstream from last quadrupole Q7. Further octupole pairs O2, O3, and O4 are situated in areas of astigmatic intermediate images, i.e., at the zero crossings of the fundamental paths, because this ensures that the error correction is largely uncoupled. Instead of an octupole O3 in plane of symmetry ZS, also two octupoles O6 and O7 may be superimposed on the third and fifth octupole, respectively.

In the exemplary embodiment described in FIG. 17, three essential aspects are advantageously combined, namely the use of a phase-shifting element 54, the anamorphotic imaging of a diffraction plane, and the color and error correction with the aid of a multipole system. Therefore it has, in addition to the above-mentioned advantages and modes of operation, also the color and error correction. These may, however, also be omitted so that the above-described multipole system is used exclusively for the anamorphotic imaging, the aspect ratio being easily settable in this exemplary embodiment.

Figure 18:
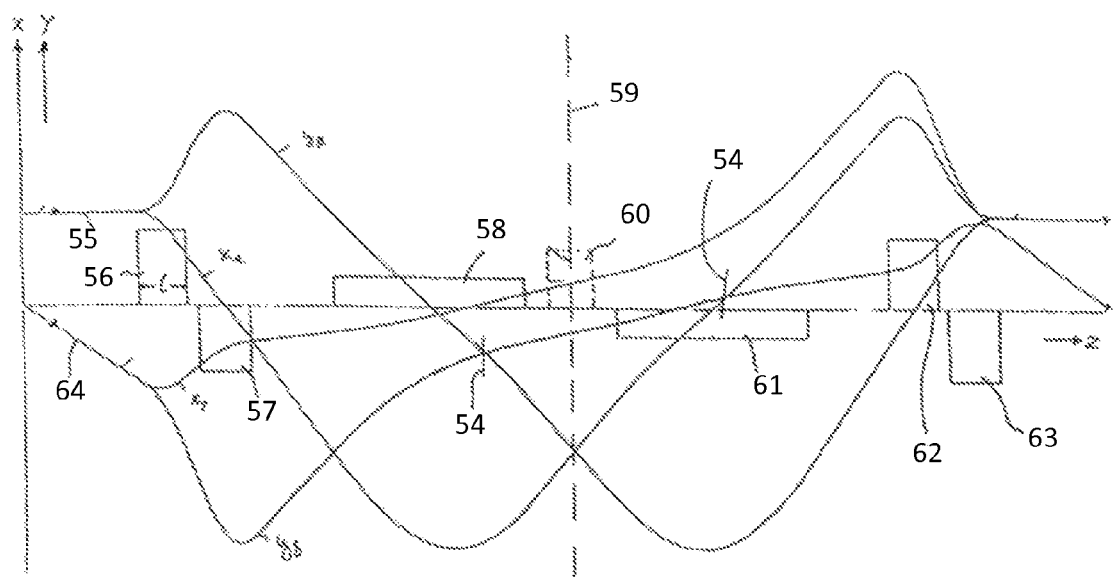
FIG. 18 shows a schematic illustration of a beam path in a bottom part of another TEM having multipole elements.

Another exemplary embodiment of a TEM which has a phase-shifting element, an anamorphotic imaging of the diffraction plane of the TEM objective, and a color and error correction is schematically illustrated in FIG. 18. The optical axis of the TEM is again labeled z. The two mutually perpendicular sections in the x and y directions are projected perpendicularly to each other.

$x_\alpha$ and $y_\beta$ denote the x component and the y component, respectively, of axial beam 55 originating from the axis of an object point (the other fundamental paths are again labeled $x_\gamma$ and $y_\delta$). The two components are deflected differently in a first quadrupole 56. An astigmatic intermediate image is obtained, the path running in the X section becoming equal to zero and thus intersecting optical axis z. Another quadrupole 57, which due to its position affects only the $y_\beta$-component and leaves the $x_\alpha$ component unaffected, is situated at this point. Another quadrupole 58 is located closest to the point where the $y_\beta$ component intersects optical axis z. At this point the $x_\alpha$ component is then influenced in the form of a reversal.

Octupole 60, which is situated symmetrically to plane of symmetry 59, is furthermore provided. In addition, additional octupoles are provided which are not illustrated in this figure.

While the illustrated exemplary embodiment has a symmetric design with respect to the arrangement of multipoles (plane of symmetry 59), quadrupoles 61 through 63 have opposite polarity with respect to quadrupoles 56 through 58. Although the beam path is asymmetric, a rectangular phase plate may also be situated here.

As mentioned previously, out-of-axis beam 64 also has two components, namely the $x_\gamma$ component and the $y_\delta$ component. These are also split by first quadrupole 56 and deflected by quadrupole 57.

In this exemplary embodiment a phase-shifting element 54 according to FIGS. 1, 2, and 3 is also provided. It may be situated at two different points. In this case also, the back focal plane, i.e., the diffraction plane, of the objective may be anamorphotically imaged in plane of symmetry 59, so that the same advantages as described previously are achieved. Situating the phase-shifting element 54 in the area of quadrupole 61 is advantageous in particular. A rather large aspect ratio results here. Although the $x_y$ component runs far away from axis z (perpendicularly to a phase-shifting direction), using a phase-shifting element 54 having a cross-shaped opening, the strongly astigmatic undiffracted particle beam (zero beam) passes through without suffering a phase shift. The diffracted particle beams of higher order, however, suffer a phase shift.

Figure 19:
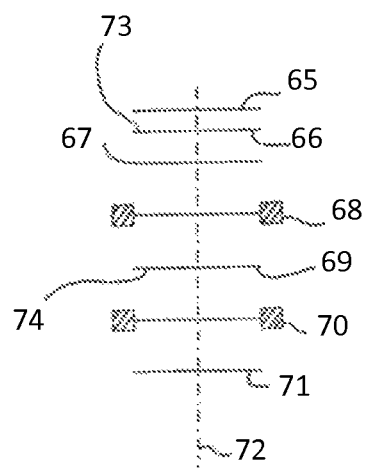
FIG. 19 shows a schematic illustration of a bottom part of a TEM having two phase-shifting elements.

FIG. 19 schematically shows another exemplary embodiment of a bottom part of a TEM. Objective 65, which has a back focal plane, i.e., diffraction plane 66, is here situated along an optical axis 72 of the TEM. In the back focal plane, i.e., diffraction plane 66, a first phase-shifting element 73 is also situated, which is designed according to FIGS. 1, 2, and 3. A first diffraction lens 67 which is followed by a quadrupole element 68 in the beam path of the TEM is situated further in the beam path of the TEM along optical axis 72. First diffraction lens 67 has an image plane which is, on the one hand, the intermediate diffraction pattern plane and, on the other hand, the conjugated plane to diffraction plane 66 of objective 65. The main plane of a second diffraction lens 69 is situated in the intermediate diffraction pattern plane. A second phase-shifting element 74, which is also designed according to the exemplary embodiment of FIGS. 1, 2, and 3, is also situated in this intermediate diffraction pattern plane. Another quadrupole element, followed by a projective lens 71, is situated downstream from second diffraction lens 69. Also in this exemplary embodiment, an enlarged image of back focal plane 66 of objective 65 in intermediate diffraction pattern plane 69 is provided with the aid of first diffraction lens 67, so that the previously mentioned advantages are also achieved here.

It should be expressly pointed out here that the embodiments described in FIGS. 14 through 19 are not limited to the application of the exemplary embodiment of the phase-shifting element illustrated in FIGS. 1, 2, and 3. Rather, any phase-shifting element using which a non-homogeneous or anisotropic potential may be generated for phase shifting may be used.

Figure 20:
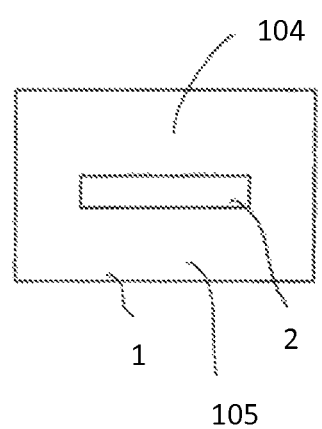
FIG. 20 shows a schematic illustration of a phase-shifting element having carbon films.

FIG. 20 shows a combination of phase-shifting element 1 according to the system described herein having two lateral carbon films 104 and 105. This embodiment combines the related art with phase-shifting element 1 according to the system described herein.

The system described herein is described with reference to a TEM, i.e., a transmission electron microscope. It should be expressly pointed out, however, that the present invention is not limited to transmission electron microscopes. Rather, the system described herein is applicable in any particle beam device in which the use of a phase-shifting element is desired, for example, also a transmission ion microscope.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A phase-shifting element, comprising:
at least one potential-generating device that generates at least one of: a non-homogeneous potential and an anisotropic potential, wherein, in use, the phase shifting element shifts a phase of at least a portion of a article beam.

2. The phase-shifting element as recited in claim 1, wherein the at least one potential-generating device includes a phase plate in which the at least one of: the non-homogeneous potential and the anisotropic potential is generated.

3. The phase-shifting element as recited in claim 1, wherein a non-rotationally symmetric opening is provided on the phase-shifting element in a perpendicular direction to a plane of the phase-shifting element for generating the at least one of: the non-homogeneous potential and the anisotropic potential.

4. The phase-shifting element as recited in claim 3, wherein the phase-shifting element has a plurality of openings.

5. The phase-shifting element as recited in claim 3, wherein the opening is slot-shaped.

6. The phase-shifting element as recited in claim 3, wherein the opening is rectangular.

7. The phase-shifting element as recited in claim 3, wherein the opening is cross-shaped.

8. The phase-shifting element as recited in claim 1, wherein the potential-generating device for generating the least one of: the non-homogeneous potential and the anisotropic potential generates an electric potential.

9. The phase-shifting element as recited in claim 1, wherein the potential-generating device for generating the at least one of: the non-homogeneous potential and the anisotropic potential generates a magnetic potential.

10. The phase-shifting element as recited in claim 1, wherein the phase-shifting element has exactly one opening.

11. The phase-shifting element as recited in claim 10,
wherein the phase-shifting element has a first element dimension along a first axis and a second element dimension along a second axis,
wherein the first axis is not parallel to the second axis, and
wherein the opening extends both along the first axis and along the second axis.

12. The phase-shifting element as recited in claim 11, wherein the opening has a first opening dimension along the first axis and a second opening dimension along the second axis, the first opening dimension being greater than the second opening dimension.

13. The phase-shifting element as recited in claim 11, wherein the first axis is situated perpendicular to the second axis.

14. The phase-shifting element as recited in claim 11, wherein the phase-shifting element has a third axis, which is not parallel either to the first axis or the second axis and along which there extends a third opening dimension.

15. The phase-shifting element as recited in claim 1, wherein the phase-shifting element has a multilayer design.

16. The phase-shifting element as recited in claim 1, wherein the phase-shifting element has at least one electrode.

17. The phase-shifting element as recited in claim 16, wherein the electrode is segmented.

18. The phase-shifting element as recited in claim 16, wherein a first electrode and a second electrode, which are individually controllable and to which different potentials may be individually applied, are provided in one plane.

19. The phase-shifting element as recited in claim 16, wherein the at least one electrode has a first side and a second side, and a first insulator is situated on the first side.

20. The phase-shifting element as recited in claim 19, wherein a second insulator is situated on the second side.

21. The phase-shifting element as recited in claim 20, wherein a second shield unit is situated on the second insulator.

22. The phase-shifting element as recited in claim 19, wherein a first shield unit is situated on the first insulator.

23. The phase-shifting element as recited in claim 1, wherein the phase-shifting element has a drift unit.

24. The phase-shifting element as recited in claim 1, wherein the phase-shifting element has at least one section having an internal potential.

\* \* \* \* \*